(12) United States Patent
Ouyang et al.

(10) Patent No.: US 11,271,056 B2
(45) Date of Patent: Mar. 8, 2022

(54) DISPLAY PANEL HAVING A RECESS DISPOSED IN THE TRANSISTION AREA

(71) Applicant: Wuhan China Star Optoelectronics Semiconductor Display Technology Co., Ltd., Wuhan (CN)

(72) Inventors: Qi Ouyang, Wuhan (CN); Mugyeom Kim, Wuhan (CN)

(73) Assignee: Wuhan China Star Optoeleetronies Semiconductor Display Technology Co., Ltd., Wuhan (CN)

( * ) Notice: Subject to any disclaimer, the term of this patent is extended or adjusted under 35 U.S.C. 154(b) by 293 days.

(21) Appl. No.: 16/633,170

(22) PCT Filed: Nov. 5, 2019

(86) PCT No.: PCT/CN2019/115516
§ 371 (c)(1),
(2) Date: Jan. 23, 2020

(87) PCT Pub. No.: WO2021/035947
PCT Pub. Date: Mar. 4, 2021

(65) Prior Publication Data
US 2021/0391398 A1    Dec. 16, 2021

(30) Foreign Application Priority Data
Aug. 28, 2019   (CN) .......................... 201910800472.8

(51) Int. Cl.
| *H01L 27/32* | (2006.01) |
| *H01L 51/52* | (2006.01) |
| *H01L 51/56* | (2006.01) |
| *H01L 51/00* | (2006.01) |

(52) U.S. Cl.
CPC ...... *H01L 27/3258* (2013.01); *H01L 27/3246* (2013.01); *H01L 51/5253* (2013.01); *H01L 51/56* (2013.01); *H01L 51/0097* (2013.01); *H01L 2227/323* (2013.01); *H01L 2251/5338* (2013.01)

(58) Field of Classification Search
CPC . H01L 27/32; H01L 27/3246; H01L 27/3248; H01L 27/3258; H01L 51/0097; H01L 51/5253; H01L 2251/5338
See application file for complete search history.

(56) References Cited

U.S. PATENT DOCUMENTS

| 2018/0315809 A1 | 11/2018 | Kim et al. |
| 2019/0036084 A1 | 1/2019 | Lee |
| 2020/0013971 A1* | 1/2020 | Park .................... H01L 51/0097 |

FOREIGN PATENT DOCUMENTS

| CN | 107204154 | 9/2017 |
| CN | 107833906 | 3/2018 |
| CN | 108288637 | 7/2018 |
| CN | 108615734 | 10/2018 |
| CN | 109065616 | 12/2018 |
| CN | 109671719 | 4/2019 |
| CN | 109671761 | 4/2019 |

* cited by examiner

*Primary Examiner* — Hoai V Pham

(57) ABSTRACT

A display panel and a display device are provided. The display panel is divided into a display area, a transition area, and a bending area. The display panel includes a first recess and a second recess. The first recess is disposed in the bending area, and the second recess is disposed in the transition area.

10 Claims, 4 Drawing Sheets

DISPLAY PANEL HAVING A RECESS DISPOSED IN THE TRANSISTION AREA

RELATED APPLICATIONS

This application is a National Phase of PCT Patent Application No. PCT/CN2019/115516 having International filing date of Nov. 5, 2019, which claims the benefit of priority of Chinese Patent Application No. 201910800472.8 filed on Aug. 28, 2019. The contents of the above applications are all incorporated by reference as if fully set forth herein in their entirety.

FIELD AND BACKGROUND OF THE INVENTION

The present disclosure relates to the field of display technologies, and more particularly to a display panel and a display device.

Organic light emitting diode (OLED) display panels are display panels made of organic self-illuminating diodes. Because the OLED display panels have self-illuminating organic electroluminescent diodes, the OLED display panels have characteristics of no backlight, high contrast, thin thickness, wide viewing angles, fast response speed, being used for flexible panels, wide temperature ranges, simple structures, and simple processes.

Specifically, the reason why the OLED display panels are flexible is that glass substrates of conventional OLED panels are not used, but a material such as plastic or metal is used as substrates. In addition to the flexibility of the OLED display panels, due to the difference in the material and composition of the substrates, the OLED display panels have large shatterproof capability and are also lighter and thinner. In addition, since the OLED display panels are self-illuminating, the OLED display panels can be pure black when displaying the darkest color. Regarding viewing angles of the OLED display panels, the OLED display panels are not distorted even under large viewing angles. The OLED display panels still have good color uniformity, good color accuracy, and good visual experience in a flexible state and thus become a new generation of trend technology that replaces liquid crystal displays.

At present, full-screen borderless display products can enable users to get a better viewing experience, which will definitely ignite a new consumer market. Pad Bending is a core technology of full-screen borderless OLED display products, so each company is developing pad bending technology to reduce a size of a frame and achieve a larger screen ratio.

As shown in FIG. 1, a display panel includes a flexible substrate 1, a buffer layer 2, an array substrate 3, a pixel defining layer 5, a supporting layer 6, and a thin film encapsulation layer 9. The array substrate includes a gate insulating layer 32, a first source drain layer 35, and a first planarization layer 36. The thin film encapsulation layer 9 includes a first inorganic layer 91, an organic layer 92, and a second inorganic layer 93. The display panel is divided into a display area 100, a transition area 200, and a bending area 300. In the prior art, an organic filling layer (ODH) 101 is disposed at a position corresponding to the buffer layer 2 and the gate insulating layer 32 of the bending area 300. Thereby, stress in the bending area is lowered, while a dam 102 is disposed in the transition area between the bending area and the display ara, thereby preventing overflow of the inkjet printing (IJP) material in the organic layer 92. However, setting the dam 102 tends to cause an increase in a width of the transition area 200, so that a frame of the display panel is increased, which is disadvantageous for achieving a narrow frame.

SUMMARY OF THE INVENTION

An object of the present invention provides a display panel and a display device to solve technical problems that a transition area has a large width and is disadvantageous for the display panel to realize a narrow frame.

In order to achieve the above object, an embodiment of the present invention provides a display panel. The display panel is divided into a display area, a transition area, and a bending area. The display panel includes a flexible substrate, a buffer layer, an array substrate, a pixel defining layer, a support layer, and a thin film encapsulation layer which are stacked in a stack, a first recess, and a second recess. The array substrate includes a gate insulating layer, a dielectric layer, a first planarization layer, a second source drain layer, and a second planarization layer. The first recess is disposed in the bending area, the first recess penetrates through the dielectric layer, the gate insulating layer, and the buffer layer, and is recessed in a side surface of the flexible substrate. The second recess is disposed in the transition area, and the second recess penetrates through the support layer, the pixel defining layer, the second planarization layer, and the first planarization layer.

In an embodiment of the present invention, the first planarization layer fills the first recess, and the thin film encapsulation layer fills the second recess.

In an embodiment of the present invention, the buffer layer is provided with a buffer through hole in the bending area, the array substrate is provided with a gate insulating through hole and an electrical layer through hole in the bending area, and the buffer through hole is opposite to the gate insulating through hole and the dielectric through hole.

In an embodiment of the present invention, the array substrate is provided with a first planarization through hole and a second planarization through hole in the transition area, the pixel defining layer is provided with a pixel defining through hole in the transition area, the support layer is provided with a support through hole in the transition area, and the first planarization through hole is opposite to the second planarization through hole, the pixel defining through hole, and the support through hole.

In an embodiment of the present invention, the flexible substrate includes a first substrate, an insulating layer disposed on a surface of a side of the first substrate, and a second substrate disposed on a surface of the insulating layer away from a side of the first substrate. A recess of the second substrate is recessed on a surface of a side of the second substrate and is disposed opposite to the buffer through hole in the bending area.

In an embodiment of the present invention, a thickness of the second substrate in the bending area is less than a thickness of the second substrate in the display area or the transition area, and the thickness of the second substrate in the bending area ranges between 2 um and 8 um.

In an embodiment of the present invention, the array substrate further includes a first source drain layer, the first source drain layer extends from the transition area to the bending area, and the second source drain layer extends from the transition area to the bending area.

In an embodiment of the present invention, the first source drain layer is disposed on an upper surface of the dielectric layer in the transition area, and the second source drain layer is disposed on an upper surface of the first planarization layer and connected to the first source drain layer in the transition area.

In an embodiment of the present invention, the first source drain layer is disposed on a sidewall and a bottom surface of the first recess in the bending area, and the second source drain layer is disposed on an upper surface of the first planarization layer in the bending area.

An embodiment of the present invention further provides a display device including the above display panel.

Beneficial effects of an embodiment of the present disclosure are that, the display panel and the display device are provided. On one hand, providing the first recess in the bending area can improve the bending characteristics of the display panel, reduce risk of disconnection, and increase a service life. On another hand, providing the second recess in the transition area can reduce a width of the transition area, so that the display panel realizes an ultra-narrow frame, thereby further increasing a screen ratio of the display panel.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments. The accompanying figures described below are only part of the embodiments of the present disclosure, from which figures those skilled in the art can derive further figures without making any inventive efforts.

Figure 1:
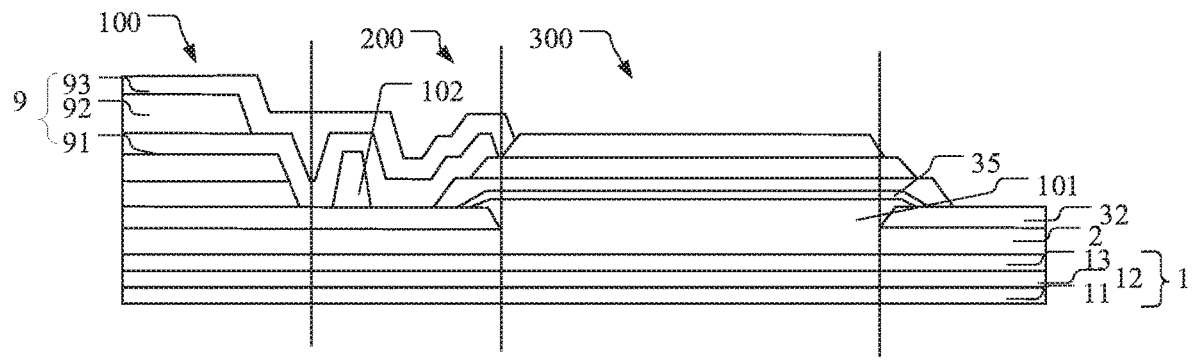
FIG. 1 is a schematic structural view of a display panel according to the prior art.

Some parts in the drawings are as follows:
100 display area; 200 transition area; 300 bending area; 301 neutral layer;
1 flexible substrate; 2 buffer layer; 3 array substrate; 4 first electrode;
5 pixel definiting layer; 6 support layer; 7 light emitting layer; 8 second electrode; 9 thin film encapsulation layer;
11 first substrate; 12 insulating layer; 13 second substrate;
31 active layer; 32 gate insulating layer; 33 gate layer; 34 dielectric layer;
35 first source drain layer; 36 first planarization layer; 37 second source drain layer; 38 second planarization layer;
91 first inorganic layer; 92 organic layer; 93 second inorganic layer; 101 organic filling layer; 102 dam;
110 second substrate recess; 111 buffer through hole; 120 first recess; 121 second recess;
113 pixels defining through hole; 114 support through hole;
115 first planarization through hole; 116 second planarization through hole;
1121 gate insulating through hole; 1122 dielectric through hole.

DESCRIPTION OF SPECIFIC EMBODIMENTS OF THE INVENTION

The preferred embodiments of the present invention are described below with reference to the accompanying drawings, which are used to exemplify the embodiments of the present invention, which can fully describe the technical contents of the present invention to make the technical content of the present invention clearer and easy to understand. However, the present invention may be embodied in many different forms of embodiments, and the scope of the present invention is not limited to the embodiments set forth herein.

Figure 2:
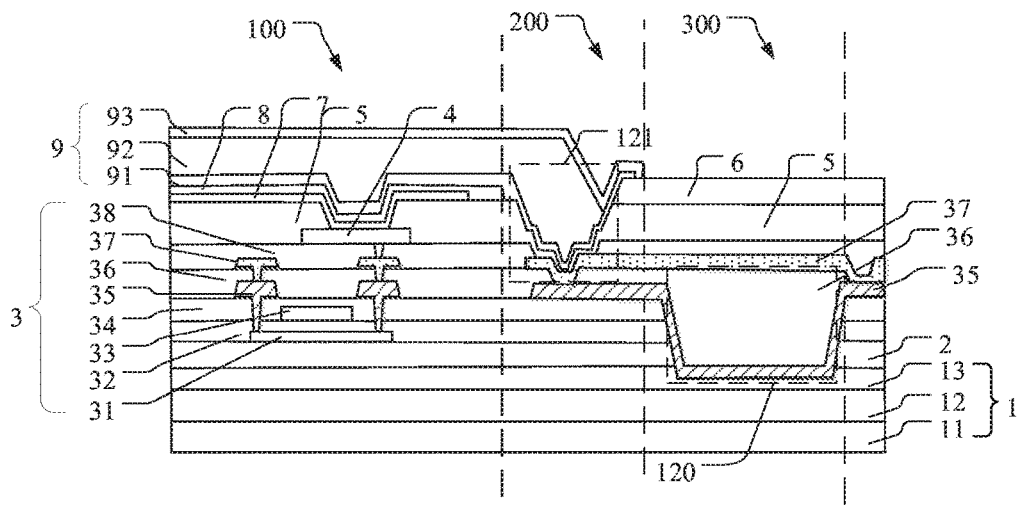
FIG. 2 is a schematic structural view of a display panel according to an embodiment of the present invention.

As shown in FIG. 2, an embodiment of the present invention provides a display panel, which is divided into a display area 100, a transition area 200, and a bending area 300 from a left side to a right side in FIG. 2. The display area 100 is used to implement a display function. The bending area 300 is provided with a relevant circuit module, and is bent below the display panel to place the relevant circuit module in a space below the display panel. The transition area 200 is disposed between the display area 100 and the bending area 300 for connecting the display area 100 with the bending area 300. In this embodiment, a first recess 120 is disposed in the bending area 300 to improve a bending property of the display panel and reduce a risk of wire breakage of a metal trace in the bending area 300. A second recess 121 is disposed in the transition area 200 to implement an ultra-narrow frame of the display panel.

The display panel includes a flexible substrate 1, a buffer layer 2, an array substrate 3, a first electrode 4, a pixel defining layer 5, a support layer 6, a light emitting layer 7, a second electrode 8, and a thin film encapsulation layer 9, in an order from a bottom to a top in FIG. 2.

The flexible substrate 1 includes a first substrate 11, an insulating layer 12, a second substrate 13, and a second substrate recess 110. The first substrate 11 is a PI substrate made of polyimide and having a thickness of 10 μm. The insulating layer 12 is provided on an upper surface of the first substrate 11, and a material of the insulating layer 12 is a material having water absorption properties such as silicon nitride (SiNx) or silicon oxide (SiOx). The second substrate 13 is provided on an upper surface of the insulating layer 12, and the second substrate 13 is a PI substrate made of polyimide. The second substrate recess 110 is recessed to an upper surface of the second substrate 13 located in the bending area 300. In the embodiment, a thickness of the second substrate 13 is not uniform. A thickness of the second substrate 13 in the bending area 300 is less than a thickness of the second substrate 13 in the display area 100 or the transition area 200. In one embodiment, the second substrate 13 located in the display area 100 and the transition area 200 has a thickness of 10 um, and the second substrate 13 located in the bending area 300 has a thickness of 2 um to 8 um.

The buffer layer 2 is disposed on an upper surface of the flexible substrate 1, and the buffer layer 2 located in the bending area 300 forms a buffer through hole 111. The buffer through hole 111 is disposed opposite to the second substrate recess 110.

The array substrate 3 is provided on an upper surface of the buffer layer 2. The array substrate 3 is formed with a plurality of through holes. The array substrate 3 includes an active layer 31, a gate insulating layer 32, a gate layer 33, a dielectric layer 34, a first source drain layer 35, a first planarization layer 36, a second source drain layer 37, and a second planarization layer 38. The through holes include a gate insulating through hole 1121, a dielectric through hole 1122, a first planarization through hole 115, and a second planarization through hole 116.

The active layer 31, the gate insulating layer 32, and the gate layer 33 are sequentially provided on the upper surface of the buffer layer 2. The gate insulating layer 32 forms the gate insulating through hole 1121 which is disposed opposite to the buffer through hole 111.

The dielectric layer 34 is disposed on upper surfaces of the gate insulating layer 32 and the gate layer 33, and the dielectric layer 34 forms the dielectric through hole 1122. The dielectric through hole 1122 is disposed opposite to the gate insulating through hole 1121, and the gate insulating through hole 1121 is disposed opposite to the buffer through hole 111.

The first source drain layer 35 is disposed on an upper surface of the dielectric layer 34, a hole wall of the dielectric through hole 1122, a hole wall of the gate insulating through hole 1121, a hole wall of the buffer layer hole 111, and side walls and a bottom surface of the second substrate recess 110.

The first planarization layer 36 is disposed on upper surfaces of the first source and drain layer 35 and the dielectric layer 34. The first planarization layer 36 forms the first planarization through hole 115. The first planarization layer 36 fills the first recess 120. The first planarization layer 36 fills the second substrate recess 110, the buffer through hole 111, the gate insulating through hole 1121, and the dielectric through hole 1122.

The second source drain layer 37 is disposed on an upper surface of the first planarization layer 36 and is connected to the first source drain layer 35. The second planarization layer 38 is provided on upper surfaces of the second source drain layer 37 and the first planarization layer 36. The second planarization layer 38 forms the second planarization through hole 116 that is disposed opposite the first planarization through hole 115.

It should be noted that the first source drain layer 35 is disposed on the upper surface of the dielectric layer 34 in the display area 100 and the transition area 200. The first source drain layer 35 is disposed on the sidewalls and the bottom surface of the first recess 120 in the bending area 300. The first planarization layer 36 fills the first recess 120. The second source drain layer 37 is disposed on the upper surface of the first planarization layer 36 in the transition area 200 and is connected to the first source drain layer 35. The second source drain layer 37 is disposed on the upper surface of the first planarization layer 36 in the bending area 300. Further, the first source drain layer 35 extends from the transition area 200 to the bending region 300, the second source drain layer 37 extends from the transition area 200 to the bending area 300, and the second source drain layer 37 is electrically connected to the first source drain layer 35 to implement a dual source drain trace (SD) to improve a performance of the display panel.

The first electrode 4 is provided on the upper surface of the array substrate 3, and the first electrode 4 is an anode made of indium tin oxide (ITO), silver (Ag) or the like.

The pixel defining layer 5 is provided on upper surfaces of the first electrode 4 and the array substrate 3. A pixel defining through hole 113 is formed in the pixel defining layer 5 of the transition area 200, which is disposed opposite to the second planarization through hole 116. A material of the pixel defining layer 5 includes, but is not limited to, polyimide, and a thickness thereof is preferably 1 um to 2 um.

The support layer 6 is provided on the upper surface of the pixel defining layer 5. A support through hole 114 is formed in the support layer 6 of the transition area 200, which is disposed opposite to the pixel defining through hole 113. A material of the support layer 6 includes, but is not limited to, polyimide, and the thickness thereof is preferably 1 um to 2 um.

The light emitting layer 7 is provided on the upper surfaces of the first electrode 4 and the pixel defining layer 5. A material of the light emitting layer 7 is an organic light emitting material, and the thickness thereof is preferably 0.2 μm to 0.5 μm.

The second electrode 8 is provided on the upper surfaces of the light emitting layer 7 and the pixel defining layer 5. The second electrode 8 is a cathode.

The thin film encapsulation layer 9 is provided on upper surfaces of the second electrode 8 and the pixel defining layer 5. The thin film encapsulation layer 9 fills the first planarization through hole 115, the second planarization through hole 116, the pixel defining through hole 113, and the support through hole 114. The thin film encapsulation layer 9 includes a first inorganic layer 91, an organic layer 92, and a second inorganic layer 93. The first inorganic layer 91 is provided on the upper surfaces of the second electrode 8 and the pixel defining layer 5. The material of the first inorganic layer 91 includes transparent oxide, fluoride, and silicon nitride, has a thickness of 0.5 um to 2 um, and has water-blocking oxygen resistance. The organic layer 92 is provided on the upper surface of the first inorganic layer 91, and the material thereof is preferably an acryl material, and the thickness thereof is 6 um to 10 um. The second inorganic layer 93 is provided on the upper surface of the organic layer 92, and the material thereof comprises transparent oxide, fluoride and silicon nitride, and has a thickness of 0.5 um to 2 um, and has water-blocking oxygen property.

Figure 3:
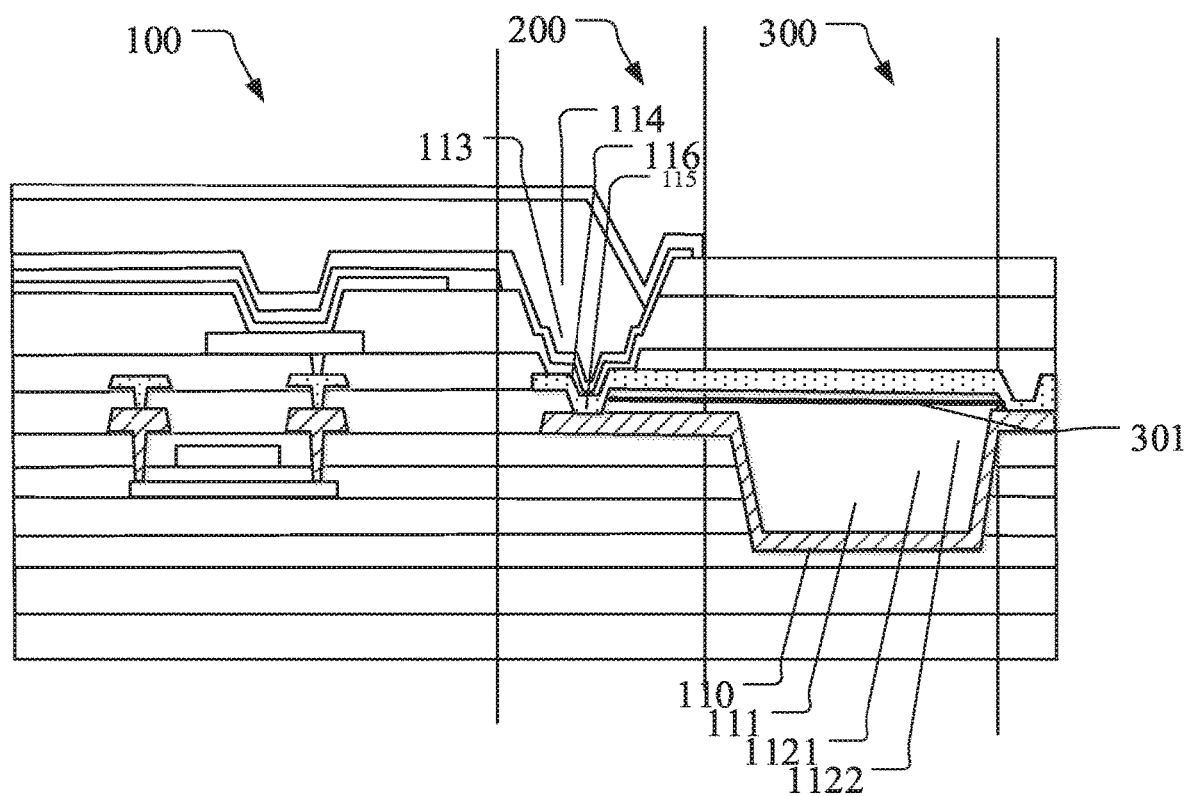
FIG. 3 is a schematic structural view showing a neutral layer when a display panel is bent according to an embodiment of the present invention.

As shown in FIG. 2 to FIG. 3, in the embodiment, the first recess 120 is disposed in the bending area 300, and the second recess 121 is disposed in the transition area 200. The first recess 120 penetrates through the dielectric layer 34, the gate insulating layer 32, and the buffer layer 2, and is recessed on a surface of a side of the flexible substrate 1. Specifically, the first recess 120 includes a second substrate recess 110, a buffer through hole 111, a gate insulating through hole 1121, and a dielectric through hole 1122. Therefore, the first recess 120 is filled with the first planarization layer 36. In the process of disposing the first recess 120, the thickness of the second substrate 13 located in the bending area 300 is smaller than the thickness of the second substrate 13 of the display area 100 or the transition area 200. This is equivalent to thinning the thickness of the second substrate 13 located in the bending area 300. Since an elastic modulus of the second substrate 13 is relatively large, the display panel has better bending characteristics.

Specifically, when the display panel is bent, a neutral layer 301 is formed in the bending area 300. Since the thickness of the second substrate 13 located in the bending area 300 is thinned, the neutral layer 301 moves upward and approaches the second source drain layer 37, thereby reducing the bending stress of the second source drain layer 37. The risk of disconnection of the traces of the second source drain layer 37 is prevented, and the bending characteristics of the display panel are improved, thereby improving the yield of the display panel. In addition, most of the first source drain layer 35 is disposed on the upper surface of the second substrate 13, and the first substrate 11 and the second substrate 13 have good flexibility. Therefore, the risk of disconnection of the traces of the first source drain layer 35 can be prevented, and the yield of the display panel can be improved.

In the prior art, referring to FIG. 1, a single-layer first source drain electrode 35 is disposed in the display panel, and an organic filling layer (ODH) 101 is disposed at a position corresponding to the buffer layer 2 and the gate insulating layer 32 located in the bending area, this improves the flexibility of the bending area, thereby reducing the stress generated after the bending area is bent. However, during the bending process of the display panel, the generated neutral layer 301 is away from the first source drain layer 35, which easily causes the trace of the first source and drain layer 35 to be easily broken, thereby affecting bending characteristics of the display panel. However, in this embodiment, a double-layer source drain layer is used, and the second substrate located in the bending area is thinned, such that the neutral layer is close to the second source drain layer, thereby further improving the flexibility of the bending area, reducing the stress generated after the bending area is bent, improving the bending characteristics of the display panel, reducing the risk of disconnection, and increasing the service life of the display panel.

It should be noted that the neutral layer in the embodiment refers to a position where the display panel is neither subjected to compressive stress nor tensile stress when bent, where the bending stress is zero. The closer the metal trace (source drain) is to the neutral plane, the less likely it is to break after the bend zone is bent.

As shown in FIGS. 2 to 3, the second recess 121 is disposed in the transition area 200, and the second recess 121 penetrates through the support layer 6, the pixel defining layer 5, the second planarization layer 38, and the first planarization layer 37. Specifically, the second recess 121 includes a first planarization through hole 115, a second planarization through hole 116, a pixel defining through hole 113, and a support through hole 114. The second recess 121 is filled with the thin film encapsulation layer 9. In the process of disposing the second recess 121, the dam existing in the prior art is removed. The subsequently formed organic layer 92 is blocked by the first planarization layer 36, the second planarization layer 38, the pixel defining layer 5, and the support layer 6 located in the transition area 200 to prevent the organic material from overflowing. Compared with the prior art, the embodiment removes the dam and shortens the width of the transition area 200, thereby facilitating the display panel to achieve a narrow frame and further increasing a screen ratio of the display panel.

An embodiment of the present invention provides a display panel. On one hand, the first recess is disposed in the bending area, which can improve the bending characteristics of the display panel, reduce the risk of disconnection, and increase the service life. On Another hand, by providing the second recess in the transition area, the width of the transition area can be shortened, thereby enabling the display panel to achieve an ultra-narrow frame.

Figure 4:
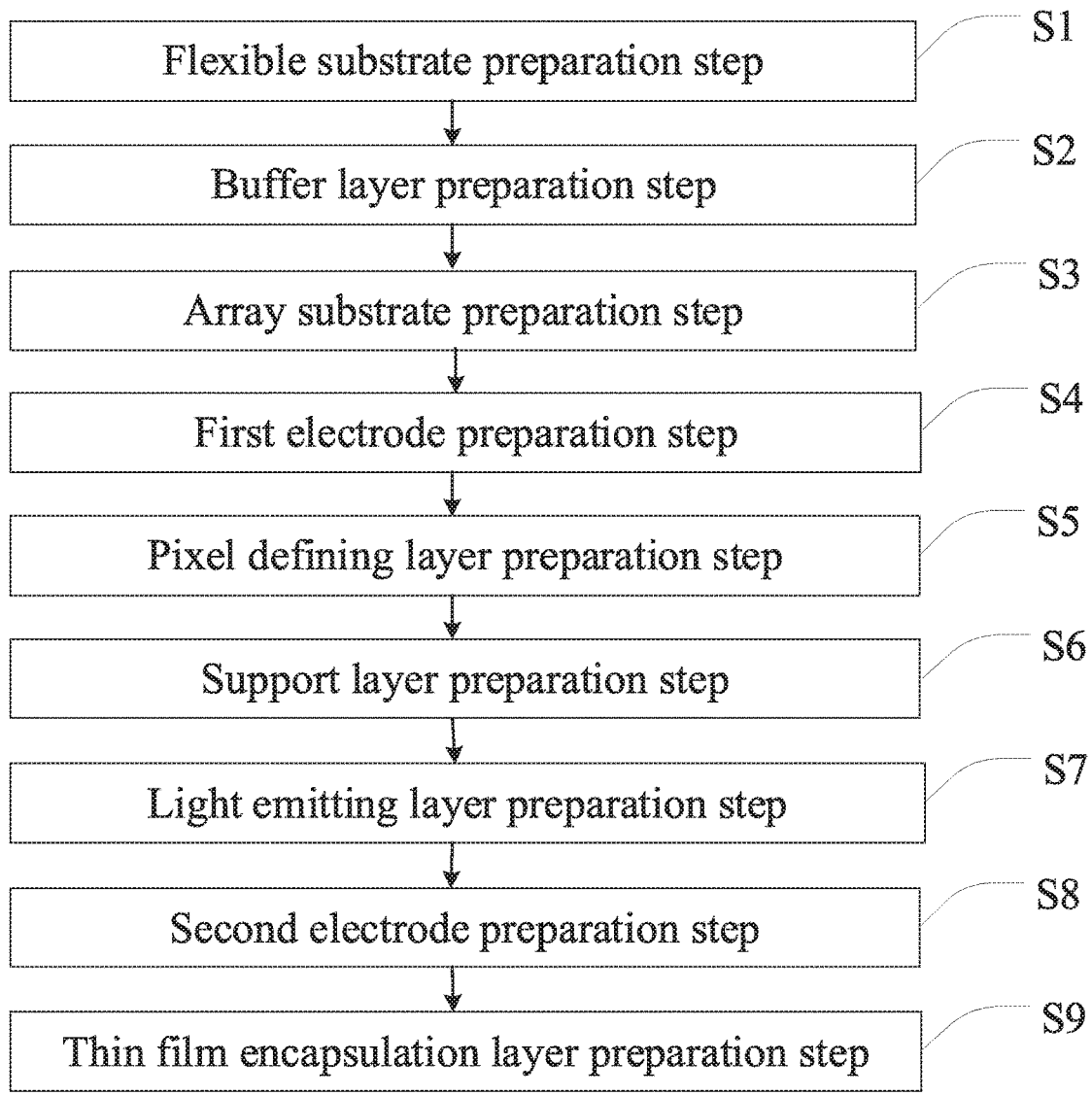
FIG. 4 is a flowchart of a method for preparing a display panel according to an embodiment of the present invention.

As shown in FIG. 4, the embodiment provides a method for preparing a display panel, which includes the following steps S1 to S9.

Figure 5:
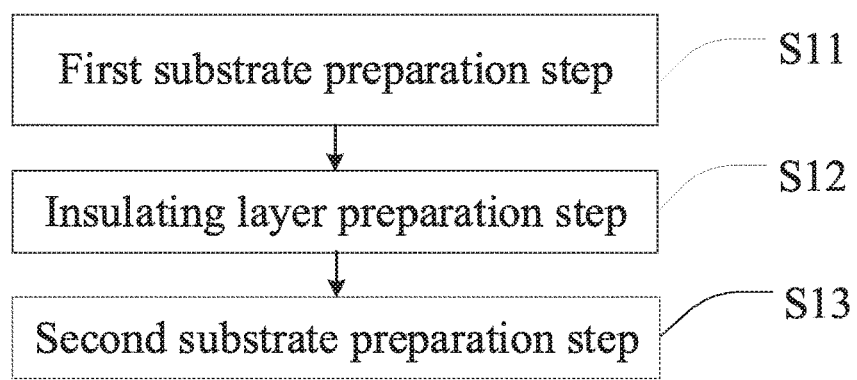
FIG. 5 is a flowchart of a method for preparing a flexible substrate according to an embodiment of the present invention.

As shown in FIG. 5, S1 a flexible substrate preparation step is performed to prepare a flexible substrate. The flexible substrate includes the following steps S11 to S13.

Specifically, In S11, a first substrate preparation step is performed to apply a polyimide solution on a surface of a glass cover to form a first substrate having a thickness of 10 um. In S12, an insulating layer preparation step, an insulating layer is prepared on an upper surface of the first substrate, and the insulating layer is made of a material having water absorption properties such as silicon nitride (SiNx) or silicon oxide (SiOx). In S13, a second substrate preparation step is performed to coat a polyimide solution on the upper surface of the insulating layer to form a second substrate, wherein the second substrate forms a second substrate recess, and the second substrate recess is located at the bending area of the display panel. The thickness of the second substrate located in the bending area is less than the thickness of the second substrate located in the display area or transition area. The second substrate located in the bending area has a thickness of 2 um to 8 um, preferably 4 um, 5 um, and 6 um. The thickness of the second substrate located in the display area and the thickness of the second substrate located in the transition area are 10 um.

In S2, a buffer layer preparation step, a buffer layer is formed on the upper surface of the flexible substrate, and the buffer layer forms a buffer through hole. The buffer through hole is opposite to the second substrate recess.

Figure 6:
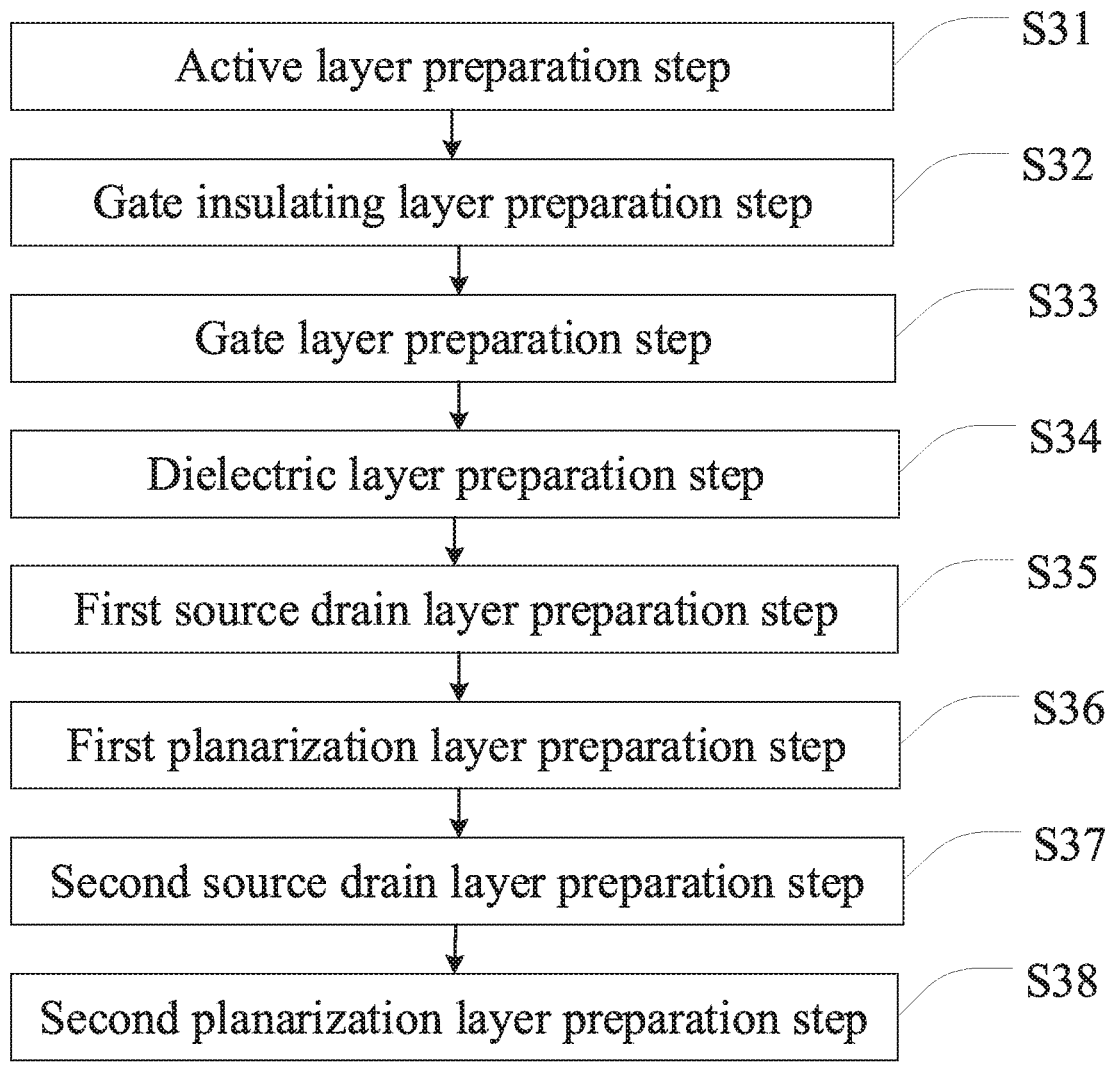
FIG. 6 is a flowchart of a method for preparing an array substrate according to an embodiment of the present invention.

As shown in FIG. 6, in S3, an array substrate preparation step, an array substrate is prepared on the upper surface of the buffer layer, and the array substrate forms a through hole. The array substrate preparation step includes steps S31 to S38.

In S31, an active layer preparation step, an active layer is prepared on the upper surface of the buffer layer by chemical vapor deposition (CVD).

In S32, a gate insulating layer preparation step, a gate insulating layer is formed on an upper surface of the active layer by a CVD process, the gate insulating layer forms a gate insulating through hole, and the gate insulating through hole is disposed opposite to the buffer through hole.

In S33, a gate layer preparation step is performed by using a physical vapor deposition (PVD) process to prepare a gate layer on the upper surface of the gate insulating layer.

In S34, a dielectric layer preparation step is performed by using a CVD process to form a dielectric layer on the upper surfaces of the first gate insulating layer and the gate layer, the dielectric layer forms a dielectric through hole, and the dielectric through hole is disposed opposite to the gate insulating through hole.

In S35, a first source drain layer preparation step is performed by using a PVD process to prepare a first source drain layer, wherein the first source drain layer is disposed on an upper surface of the dielectric layer, a hole wall of the dielectric through hole, a hole wall of the gate insulating through hole, a hole wall of the buffer through hole, and sidewalls and a bottom surface of the second substrate recess.

In S36, a first planarization layer preparation step is performed by preparing a first planarization layer on the first source drain layer and an upper surface of the dielectric layer by a PVD process, wherein the first planarization layer forms a first planarization through hole. The first planarization layer fills the second substrate recess, the buffer through hole, the gate insulating through hole, and the dielectric through hole.

In S37, a second source drain layer preparation step is performed to prepare a second source drain layer on the upper surface of the first planarization layer.

In S38, a second planarization layer preparation step is performed to prepare a second planarization layer on the upper surfaces of the second source drain layer and the first planarization layer. The second planarization layer forms a second planarization through hole that is disposed opposite the first planarization through hole.

In S4, a first electrode preparation step is performed to prepare a first electrode on the upper surface of the array substrate.

In S5, a pixel defining layer preparation step is performed to deposit a polyimide material on the first electrode and the upper surface of the array substrate by a CVD process to form a pixel defining layer. The pixel defining layer forms a pixel defining through hole that is disposed opposite to the second planarization through hole. A thickness of the pixel defining layer is preferably 1 um to 2 um.

In S6, a support layer preparation step is performed by depositing a polyimide material on the upper surface of the pixel defining layer by a CVD process to form a support layer. The support layer forms a support through hole that is disposed opposite to the pixel defining through hole.

In S7, a light emitting layer preparation step is performed to deposit an organic light emitting material on the upper surface of the first electrode and the pixel defining layer to form a light emitting layer, and the thickness thereof is preferably 0.2 um to 0.5 um.

In S8, a second electrode preparation step is performed by preparing a second electrode on the light emitting layer and the upper surface of the pixel defining layer.

Figure 7:
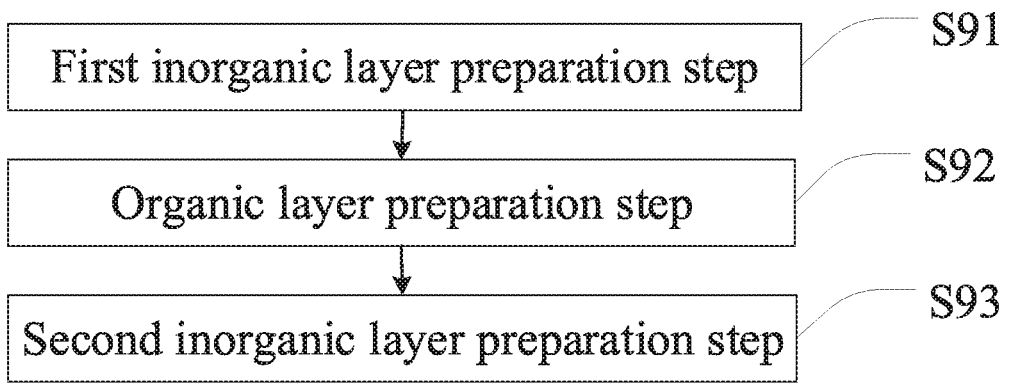
FIG. 7 is a flowchart of a method for preparing a thin film encapsulation layer according to an embodiment of the present invention.

As shown in FIG. 7, in S9, a thin film encapsulation layer preparation step is performed to prepare a thin film encapsulation layer on the light emitting layer, the pixel defining layer, and the upper surface of the second electrode. The thin film encapsulation layer fills the first planarization through hole, the second planarization through hole, the pixel defining through hole, and the support through hole. The thin film encapsulation layer preparation step includes the following steps S91 to S93.

In S91, a first inorganic layer preparation step is performed by depositing an inorganic material on the upper surface of the second electrode and the pixel defining layer by a CVD process to form a first inorganic layer. The first inorganic layer extends to the support layer. The material of the first inorganic layer includes a transparent oxide, a fluoride, and a silicon nitride. The first inorganic layer has a thickness of 0.5 um to 2 um and has water-blocking oxygen properties.

In S92, an organic layer preparation step is performed by ink-jet printing (IJP) the organic material on the upper surface of the first inorganic layer to form an organic layer having a thickness of 6 um to 10 um.

In S93, a second inorganic layer preparation step is performed by depositing an inorganic material on the upper surface of the organic layer by a CVD process to form a second inorganic layer. The second inorganic layer extends to the upper surfaces of the first inorganic layer and the support layer. The material of the second inorganic layer includes transparent oxide, fluoride, and silicon nitride. The second inorganic layer has a thickness of 0.5 um to 2 um and has water-blocking oxygen property.

In this embodiment, the through holes includes the gate insulating through hole, the dielectric through hole, the first planarization through hole, and the second planarization through hole. The second substrate recess is disposed opposite to the buffer through hole, the gate insulating through hole, and the dielectric through hole. The first planarization through hole is disposed opposite to the second planarization through hole, the pixel defining layer, and the support through hole.

Further, the second substrate recess, the buffer through hole, the gate insulating through hole, and the dielectric through hole form the first recess. The first recess is disposed in the bending area of the display panel. In this embodiment, the first recess is filled by the first planarization layer. In the process of disposing the first recess, the thickness of the second substrate located in the bending area is smaller than the thickness of the second substrate of the display area or the transition area. This is equivalent to thinning the thickness of the second substrate located in the bending area. Since the elastic modulus of the second substrate is relatively large, the display panel has better bending characteristics.

Specifically, when the display panel is bent, the neutral layer is formed in the bending area. Since the thickness of the second substrate located in the bending area is thinned, the neutral layer moves upward and approaches the second source drain layer, thereby reducing the bending stress of the second source drain layer. The risk of disconnection of the traces of the second source drain layer is prevented, and the bending characteristics of the display panel are improved, thereby improving the yield of the display panel. In addition, most of the first source drain layer is disposed on the upper surface of the second substrate, and the first substrate and the second substrate have good flexibility. Therefore, the risk of disconnection of the traces of the first source and drain layers can be prevented, and the yield of the display panel can be improved.

The second recess includes a first planarization through hole, a second planarization through hole, a pixel defining through hole, and a support through hole to form the second recess. The second recess is disposed in the transition area of the display panel. In the embodiment, the dam existing in the prior art is removed. The subsequently formed organic layer is blocked by the first planarization layer, the second planarization layer, the pixel defining layer, and the support layer located in the transition area to prevent the organic material from overflowing. Compared with the prior art, the embodiment removes the dam and shortens the width of the transition area, thereby facilitating the display panel to achieve a narrow frame and further increasing a screen ratio of the display panel.

An embodiment of the present invention provides a display panel. On one hand, the first recess is disposed in the bending area, which can improve the bending characteristics of the display panel, reduce the risk of disconnection, and increase the service life. On Another hand, by providing the second recess in the transition area, the width of the transition area can be shortened, thereby enabling the display panel to achieve an ultra-narrow frame and further increase a screen ratio of the display panel.

The embodiment further provides a display device including the display panel as described above and a preparation method thereof. The display device can be any product or component having display function such as electronic paper, mobile phone, tablet computer, television, display, notebook computer, digital photo frame, navigator and the like. The display device improves the performance of the display device by realizing a display panel of an ultra-narrow frame, thereby improving the user experience.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A display panel, wherein the display panel is divided into a display area, a transition area, and a bending area, the display panel comprising:
   a flexible substrate, a buffer layer, an array substrate, a pixel defining layer, a support layer, and a thin film encapsulation layer which are stacked in a stack, wherein the array substrate comprises a gate insulating layer, a dielectric layer, a first planarization layer, a second source drain layer, and a second planarization layer;
   a first recess disposed in the bending area, the first recess penetrating through the dielectric layer, the gate insulating layer, and the buffer layer, and recessed in a side surface of the flexible substrate; and
   a second recess disposed in the transition area, and the second recess penetrating through the support layer, the pixel defining layer, the second planarization layer, and the first planarization layer.

2. The display panel according to claim 1, wherein the first planarization layer fills the first recess, and the thin film encapsulation layer fills the second recess.

3. The display panel according to claim 1, wherein the buffer layer is provided with a buffer through hole in the bending area, the array substrate is provided with a gate insulating through hole and an electrical layer through hole in the bending area, and the buffer through hole is opposite to the gate insulating through hole and the dielectric through hole.

4. The display panel according to claim 1, wherein the array substrate is provided with a first planarization through hole and a second planarization through hole in the transition area, the pixel defining layer is provided with a pixel defining through hole in the transition area, the support layer is provided with a support through hole in the transition area, and the first planarization through hole is opposite to the second planarization through hole, the pixel defining through hole, and the support through hole.

5. The display panel according to claim 1, wherein the flexible substrate comprises:
   a first substrate;
   an insulating layer disposed on a surface of a side of the first substrate; and
   a second substrate disposed on a surface of the insulating layer away from a side of the first substrate;
   wherein a recess of the second substrate is recessed on a surface of a side of the second substrate and is disposed opposite to the buffer through hole in the bending area.

6. The display panel according to claim 5, wherein a thickness of the second substrate in the bending area is less than a thickness of the second substrate in the display area or the transition area, and the thickness of the second substrate in the bending area ranges between 2 um and 8 um.

7. The display panel according to claim 1, wherein the array substrate further comprises a first source drain layer, the first source drain layer extends from the transition area to the bending area, and the second source drain layer extends from the transition area to the bending area.

8. The display panel according to claim 7, wherein the first source drain layer is disposed on an upper surface of the dielectric layer in the transition area, and the second source drain layer is disposed on an upper surface of the first planarization layer and connected to the first source drain layer in the transition area.

9. The display panel according to claim 7, wherein the first source drain layer is disposed on a sidewall and a bottom surface of the first recess in the bending area, and the second source drain layer is disposed on an upper surface of the first planarization layer in the bending area.

10. A display device comprising the display panel according to claim 1.

* * * * *

UNITED STATES PATENT AND TRADEMARK OFFICE
CERTIFICATE OF CORRECTION

| | |
|---|---|
| PATENT NO. | : 11,271,056 B2 |
| APPLICATION NO. | : 16/633170 |
| DATED | : March 8, 2022 |
| INVENTOR(S) | : Ouyang et al. |

It is certified that error appears in the above-identified patent and that said Letters Patent is hereby corrected as shown below:

On the Title Page

Item (73) Assignee:
"Wuhan China Star Optoelectronies Semiconductor Display Technology Co., Ltd."
Should be changed to:
--Wuhan China Star Optoelectronics Semiconductor Display Technology Co., Ltd.--

Signed and Sealed this
Twentieth Day of September, 2022

Katherine Kelly Vidal
*Director of the United States Patent and Trademark Office*